(12) United States Patent
Ho et al.

(10) Patent No.: US 7,641,488 B2
(45) Date of Patent: Jan. 5, 2010

(54) CONNECTING CONFIGURATION FOR FLEXIBLE WIRED CIRCUIT BOARD AND ELECTRONIC DEVICE

(75) Inventors: Voon Yee Ho, Osaka (JP); Szu-Han Hu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/010,177

(22) Filed: Jan. 22, 2008

(65) Prior Publication Data

US 2008/0182435 A1   Jul. 31, 2008

(30) Foreign Application Priority Data

Jan. 31, 2007   (JP) ............... 2007-021958

(51) Int. Cl.
*H01R 3/00* (2006.01)
(52) U.S. Cl. .................................. 439/162
(58) Field of Classification Search .......... 439/162; 174/69; 455/575.4
See application file for complete search history.

(56) References Cited

U.S. PATENT DOCUMENTS

| 3,818,122 | A | * | 6/1974 | Luetzow | ............. | 174/86 |
| 4,715,928 | A | * | 12/1987 | Hamby | ............. | 216/18 |
| 6,973,186 | B2 | | 12/2005 | Shin | | |
| 6,990,355 | B2 | | 1/2006 | Ueyama et al. | | |
| 7,409,236 | B1 | * | 8/2008 | Luna et al. | ............. | 455/575.1 |

* cited by examiner

*Primary Examiner*—Phuong K Dinh
(74) *Attorney, Agent, or Firm*—Jean C. Edwards, Esq.; Akerman Senterfitt (57) ABSTRACT

A connecting configuration for a flexible wired circuit board includes a first terminal member, a second terminal member, and a flexible wired circuit board having a conductive pattern for electrically connecting the first terminal member and the second terminal member. The first terminal member and the second terminal member are provided such that at least one of the terminal members is linearly movable to be adjacent to and apart from the other terminal member. The flexible wired circuit board is provided to be wound or twisted in the middle of the moving direction.

4 Claims, 7 Drawing Sheets

CONNECTING CONFIGURATION FOR FLEXIBLE WIRED CIRCUIT BOARD AND ELECTRONIC DEVICE

CROSS-REFERENCE TO RELATED APPLICATION

This application claims priority from Japanese Patent Application No. 2007-021958 filed on Jan. 31, 2007, the content of which is herein incorporated by reference in its entirety.

BACKGROUND OF THE INVENTION

1. Field of the Invention

The present invention relates to a connecting configuration for a flexible wired circuit board and an electronic device and, more particularly to a connecting configuration for a flexible wired circuit board and an electronic device including the connecting configuration.

2. Description of the Related Art

A flexible wired circuit board, which is a thin wired circuit board excellent in flexibility, is disposed in the movable portion of an electronic device, such as a cellular phone, where the space is narrow.

For example, in a foldable cellular phone including an upper housing, a lower housing, and a hinge portion for supporting the upper housing and the lower housing openably/closably, it is proposed to dispose a flexible printed board (flexible wired circuit board) such that it is wound around the hinge portion to electrically connect the upper housing and the lower housing (see, e.g., the specification of U.S. Pat. No. 6,990,355 (FIG. 7)).

On the other hand, in recent years, a slidable cellular phone has been known which includes an upper housing and a lower housing without a hinge portion so that, when the lower housing is used, the lower housing is partly exposed from the upper housing by sliding the lower housing with respect to the upper housing.

In such a slidable cellular phone, a flexible wired circuit board electrically connecting the upper housing and the lower housing needs to correspond to a span over which the lower housing slides with respect to the upper housing. To satisfy the need, it is proposed to dispose an FPCB (flexible wired circuit board) in a meandering (S-shaped) shape in which linear flat-plate portions and curved bent portions having a small radius of curvature are alternately formed (see, e.g., the specification of U.S. Pat. No. 6,973,186 (FIG. 3)).

SUMMARY OF THE INVENTION

However, in the slidable cellular phone described in the specification of U.S. Pat. No. 6,973,186, the flexible wired circuit board is fatigued by continued use. More specifically, when the lower housing slides with respect to the upper housing to be exposed therefrom, the bent portions locally extend linearly. On the other hand, when the lower housing slides with respect to the upper housing to be covered therewith, the bent portions are locally curved. When such sliding of the lower housing with respect to the upper housing is repeated, the flexible wired circuit board is locally fatigued at the bent portions. As a result, the problem occurs that conductive wires in the bent portions are broken by the fatigue.

Moreover, in recent years, a slidable cellular phone has also been required to be thinner. However, when the slidable cellular phone is slimmed, the radius of curvature of the bent portions of the flexible wired circuit board is smaller so that the local fatigue mentioned above is more notable.

It is therefore an object of the present invention to provide a connecting configuration for a flexible wired circuit board which allows effective prevention of a broken wire in the conductive pattern of the flexible wired circuit board resulting from continued use and an electronic device including the connecting configuration.

A connecting configuration for a flexible wired circuit board according to the present invention comprises a first terminal member, a second terminal member, and a flexible wired circuit board having a conductive pattern for electrically connecting the first terminal member and the second terminal member, wherein the first terminal member and the second terminal member are provided such that at least one of the terminal members is linearly movable to be adjacent to and apart from the other terminal member, and the flexible wired circuit board is provided to be wound or twisted in a middle of a moving direction.

In the connecting configuration for the flexible wired circuit board, the flexible wired circuit board is provided to be wound or twisted in the middle of the moving direction in which the first terminal member or the second terminal member linearly moves. Accordingly, when at least one of the first terminal member and the second terminal member linearly moves to be apart from the other, the wound part or the twisted part of the flexible wired circuit board in the middle of the moving direction extends, while the radius of curvature of the entire wound part or the twisted part gradually decreases. When at least one of the first terminal member and the second terminal member linearly moves to be adjacent to the other, the wound part or the twisted part of the flexible wired circuit board in the middle of the moving direction contracts, while the radius of curvature of the entire wound part or the twisted part gradually increases. This avoids local fatigue of the flexible wired circuit board and allows effective prevention of a broken wire in the conductive pattern of the flexible wired circuit board resulting from continued use.

As a result, it is possible to reduce the thickness by decreasing the radius of curvature of the wound part or the twisted part and also ensure the reliability of electrical connection between the first terminal member and the second terminal member over a long period of time.

In the connecting configuration for the flexible wired circuit board, it is preferable that the flexible wired circuit board comprises a reinforcing layer formed on both end portions of the flexible wired circuit board in a direction perpendicular to the moving direction in the middle thereof.

In the connecting configuration for the flexible wired circuit board, the reinforcing layer can reinforce the flexible wired circuit board in the middle of the moving direction. As a result, it is possible to extend or contract the wound part or the twisted part, while ensuring the rigidity of the flexible wired circuit board. This allows more effective prevention of a broken wire in the conductive pattern of the flexible wired circuit board.

It is preferable that the connecting configuration for the flexible wired circuit board further comprises a first supporting member that supports the first terminal member and a second supporting member that supports the second terminal member, wherein the first supporting member and the second supporting member are provided such that at least one of the supporting members is slidable with respect to the other supporting member.

In the connecting configuration for the flexible wired circuit board, by sliding the first supporting member or the second supporting member, it is possible to ensure the linear movement of the first terminal member or the second terminal member and improve the connection reliability of the flexible wired circuit board.

In the connecting configuration for the flexible wired circuit board, it is preferable that a twisted part or a wound part of the flexible wired circuit board is extendable and contractable along the moving direction.

When the first terminal member or the second terminal member linearly moves, the wound part or the twisted part extends or contracts along the moving direction. As a result, it is possible to efficiently reduce the stress exerted by the movement on the flexible wired circuit board. This allows more effective prevention of a broken wire in the conductive pattern resulting from local fatigue.

An electronic device according to the present invention comprises a first supporting member that supports a first terminal member, a second supporting member that supports a second terminal member, and a flexible wired circuit board having a conductive pattern for electrically connecting the first terminal member and the second terminal member, wherein the first supporting member and the second supporting member are provided such that at least one of the supporting members is slidable with respect to the other supporting member, and the flexible wired circuit board is provided to be wound or twisted in a middle of a sliding direction.

In the electronic device, the flexible wired circuit board is provided to be wound or twisted in the middle of the sliding direction in which the first terminal member or the second terminal member slides. Accordingly, when at least one of the first supporting member and the second supporting member slides to be apart from the other, the wound part or the twisted part of the flexible wired circuit board in the middle of the sliding direction extends, while the radius of curvature of the entire wound part or the twisted part gradually decreases. When at least one of the first supporting member and the second supporting member slides to be adjacent to the other, the wound part or the twisted part of the flexible wired circuit board in the middle of the sliding direction contracts, while the radius of curvature of the entire wound part or the twisted part gradually increases. This avoids local fatigue of the flexible wired circuit board and allows effective prevention of a broken wire in the conductive pattern of the flexible wired circuit board resulting from continued use.

As a result, it is possible to reduce the thickness of the electronic device by decreasing the radius of curvature of the wound part or the twisted part and also ensure the reliability of electrical connection between the first terminal member and the second terminal member over a long period of time.

DETAILED DESCRIPTION OF THE INVENTION

Figure 1:
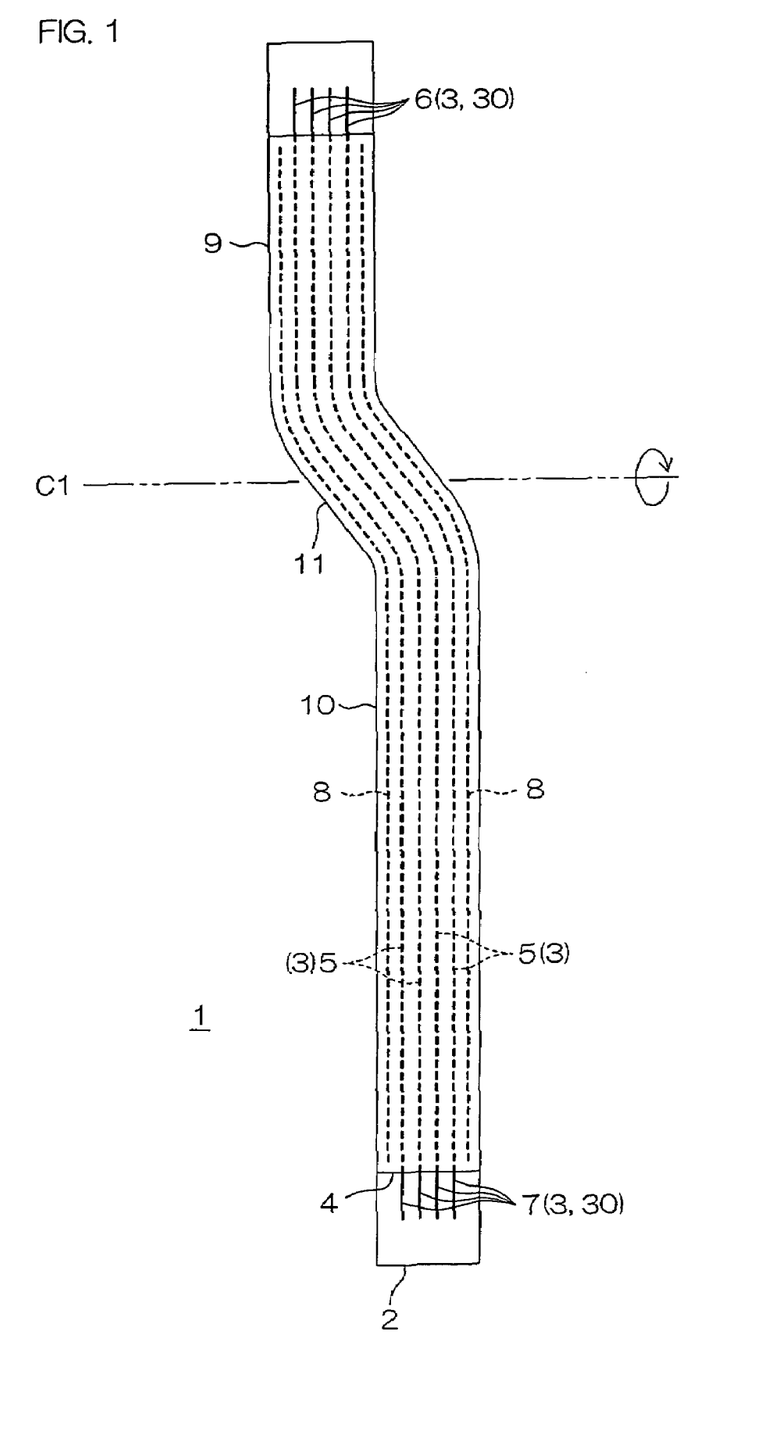
FIG. 1 is a plan view of an embodiment (wound embodiment) of a flexible wired circuit board used in a connecting configuration for the flexible wired circuit board according to the present invention.
Figure 2:
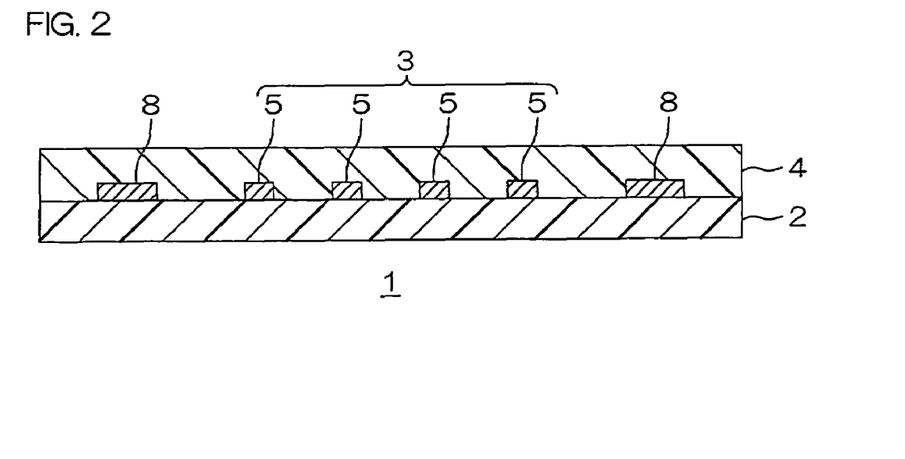
FIG. 2 is a cross-sectional view along the widthwise direction of the flexible wired circuit board shown in FIG. 1.
Figure 3:
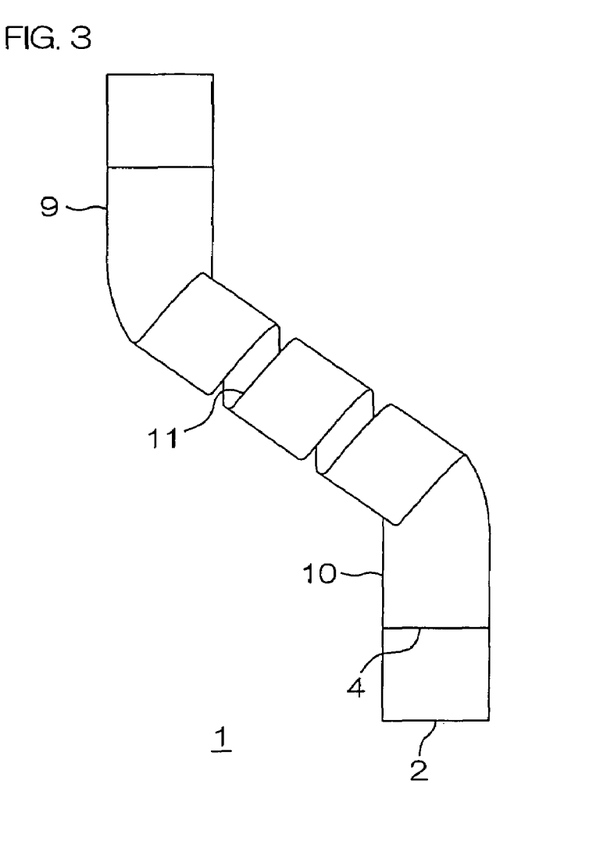
FIG. 3 is a view illustrating a wound state of the flexible wired circuit board shown in FIG. 1.
Figure 4:
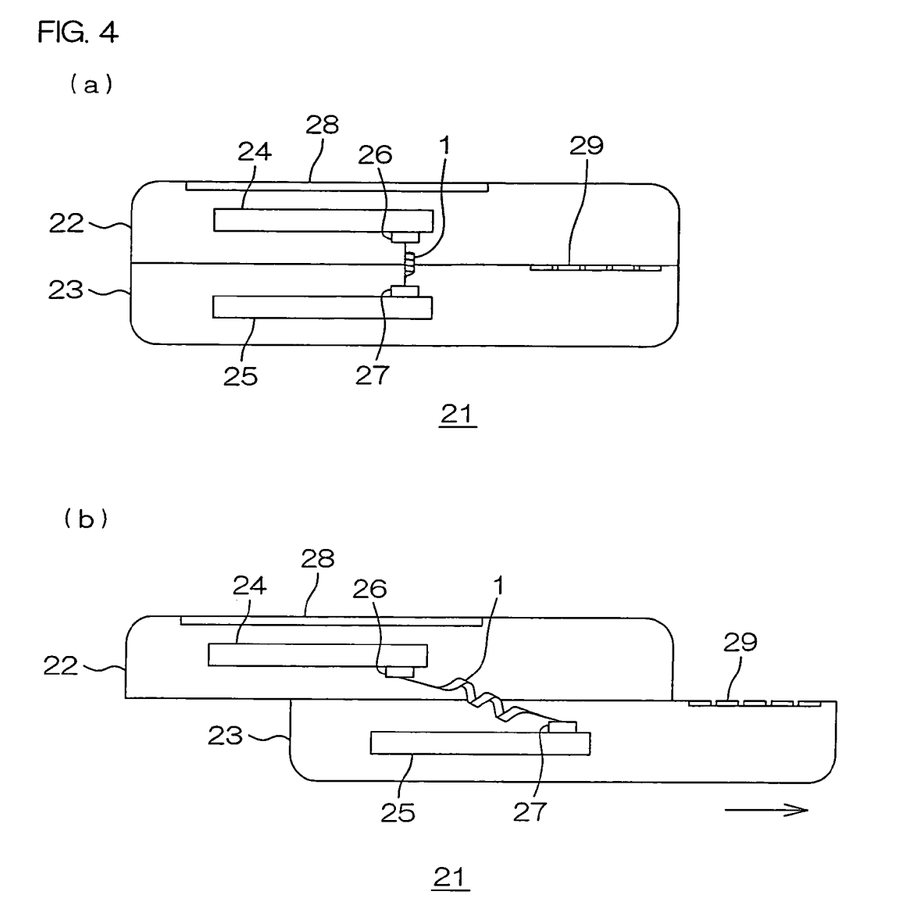
FIG. 4 is a side cross-sectional view of a cellular phone including the connecting configuration for the flexible wired circuit board shown in FIG. 3 as an embodiment (wound embodiment) of an electronic device according to the present invention, (a) showing a side cross-sectional view in a non-operating state, and (b) showing a side cross-sectional view in an operating state.

FIG. 1 is a plan view of an embodiment (wound embodiment) of a flexible wired circuit board used in a connecting configuration for the flexible wired circuit board according to the present invention. FIG. 2 is a cross-sectional view along a perpendicular direction (widthwise direction; hereinafter referred to as such) to the longitudinal direction of the flexible wired circuit board shown in FIG. 1. FIG. 3 is a view illustrating a wound state of the flexible wired circuit board shown in FIG. 1. FIG. 4 is a side cross-sectional view of a cellular phone including the connecting configuration for the flexible wired circuit board shown in FIG. 3 as an embodiment (wound embodiment) of an electronic device according to the present invention, (a) showing a side cross-sectional view in a non-operating state, and (b) showing a side cross-sectional view in an operating state. In FIG. 3, a conductive pattern 3, described later, is omitted for clear illustration of the wound state of the flexible wired circuit board.

In FIG. 1, a flexible wired circuit board 1 is a wired circuit board formed in the shape of a flat belt extending in the longitudinal direction. The flexible wired circuit board 1 integrally comprises a first linear portion 9, a second linear portion 10, and a first skew portion 11.

The first linear portion 9 is disposed on one longitudinal side (hereinafter referred to as a front side) of the flexible wired circuit board 1 and formed in a linear shape extending along the longitudinal direction. On the front end portion of the first linear portion 9, front-side connecting terminal portions 6, described later, are formed.

The second linear portion 10 is disposed on the other longitudinal side (hereinafter referred to as a rear side) of the flexible wired circuit board 1 and formed to be longer than the first linear portion 9 in the longitudinal direction. The second linear portion 10 is formed in a linear shape extending along the longitudinal direction to have the same width as the first linear portion 9. On the rear end portion of the second linear portion 10, rear-side connecting terminal portions 7, described later, are formed.

The first skew portion 11 is disposed between the first linear portion 9 and the second linear portion 10 to be continued to the rear end portion of the first linear portion 9 and to the front end portion of the second linear portion 10. The first skew portion 11 is shorter than the first linear portion 9 in the longitudinal direction to have the same width as the first linear portion 9 in the widthwise direction. The first skew portion 11 is formed in a linear shape extending along an oblique direction (direction extending obliquely between the upper left and the lower right in FIG. 1) intersecting the longitudinal direction of each of the first linear portion 9 and the second linear portion 10.

That is, in the middle of the longitudinal direction, the flexible wired circuit board 1 is formed to run from the rear end portion of the first linear portion 9 to the front end portion of the first skew portion 11 with a curvature in the oblique direction, then to run from the rear end portion of the first skew portion 11 to the front end portion of the second linear portion 10 with a curvature in the longitudinal direction.

As shown in FIG. 2, the flexible wired circuit board 1 includes an insulating base layer 2, a conductive pattern 3 formed on the insulating base layer 2, reinforcing layers 8 formed on the insulating base layer 2, and an insulating cover layer 4 formed on the insulating base layer 2 to cover the conductive pattern 3 and the reinforcing layers 8.

As shown in FIG. 1, the insulating base layer 2 is formed in the shape of a flat belt corresponding to the outer shape of the flexible wired circuit board 1. More specifically, the insulating base layer 2 is provided continuously over the first linear portion 9, the first skew portion 11, and the second linear portion 10.

The thickness of the insulating base layer 2 is in the range of, e.g., 5 to 50 μm, or preferably 10 to 30 μm. The width (widthwise length; hereinafter referred to as such) of the insulating base layer 2 is in the range of, e.g., 1 to 40 mm, or preferably 5 to 20 mm. The length (longitudinal length; hereinafter referred to as such) of the insulating base layer 2 is in the range of, e.g., 10 to 300 mm, or preferably 20 to 80 mm.

The conductive pattern 3 integrally includes wires 5, and the front-side connecting terminal portions 6 and the rear-side connecting terminal portions 7 connected to the wires 5. The wires 5, the front-side connecting terminal portions 6, and the rear-side connecting terminal portions 7 are formed as a wired circuit pattern on the insulating base layer 2.

The wires 5 are provided along the longitudinal direction of the flexible wired circuit board 1. More specifically, the wires 5 are provided continuously over the first linear portion 9 (except for the portion where the front-side connecting terminal portions 6 are formed), the first skew portion 11, and the second linear portion 10 (except for the portion where the rear-side connecting terminal portions 7 are formed). The plurality of (four) wires 5 are arranged in parallel to be spaced-apart from each other in the widthwise direction.

The front-side connecting terminal portions 6 are disposed on the front end portion of the first linear portion 9 of the flexible wired circuit board 1. The front-side connecting terminal portions 6 are arranged in parallel to be spaced apart from each other along the widthwise direction. The plurality of (four) front-side connecting terminal portions 6 are provided to be connected to the respective front end portions of the wires 5. To the front-side connecting terminal portions 6, an upper connector 26 (see FIG. 4) of a cellular phone 21, described later, is connected.

The rear-side connecting terminal portions 7 are disposed on the rear end portion of the second linear portion 10 of the flexible wired circuit board 1. The rear-side connecting terminal portions 7 are arranged in parallel to be spaced apart from each other along the widthwise direction. The plurality of (four) rear-side connecting terminal portions 7 are provided to be connected to the respective rear end portions of the wires 5. To the rear-side connecting terminal portions 7, a lower connector 27 (see FIG. 4) of the cellular phone 21, described later, is connected.

The widthwise center lines of the front-side connecting terminal portions 6 along the extending directions thereof are shifted in the widthwise direction from the widthwise center lines of the rear-side connecting terminal portions 7 along the extending directions thereof.

The front-side connecting terminal portions 6 and the rear-side connecting terminal portions 7 are hereinafter simply described as a terminal portion 30 when distinction therebetween is not particularly needed.

The reinforcing layers 8 are formed in a linear pattern disposed on the both widthwise side edge portions of the flexible wired circuit board 1 in the middle of the longitudinal direction thereof. More specifically, each of the reinforcing layers 8 is provided over the first linear portion 9 (except for the portion where the front-side connecting terminal portions 6 are formed), the first skew portion 11, and the second linear portion 10 (except for the portion where the rear-side connecting terminal portions 7 are formed). The reinforcing layers 8 are provided in two lines on both outsides of the widthwise outermost wires 5 of the conductive pattern 3 to be spaced apart from the widthwise outermost wires 5.

The thickness of the reinforcing layer 8 is the same as that of the conductive pattern 3 and in the range of, e.g., 3 to 30 μm, or preferably 5 to 20 μm. In the conductive pattern 3, the width of each of the wires 5 is in the range of, e.g., 10 to 100 μm, or preferably 30 to 50 μm. The spacing between the individual wires 5 is in the range of, 10 to 100 μm, or preferably 30 to 55 μm. The length of the wire 5 is in the range of, e.g., 10 to 300 mm, or preferably 20 to 80 mm. The length of the terminal portion 30 is in the range of, e.g., 3 to 200 mm, or preferably 50 to 100 mm. The width of each of the reinforcing layers 8 is in the range of, e.g., 10 to 500 μm, or preferably 30 to 200 μm. The distance between the reinforcing layer 8 and the wire 5 adjacent thereto is in the range of, e.g., 10 to 300 μm, or preferably 30 to 200 μm. The distance between the reinforcing layer 8 and the end edge of the insulating base layer 2 adjacent thereto is in the range of, e.g., 20 to 300 μm, or preferably 50 to 200 μm.

The insulating cover layer 4 is formed in the shape of a flat belt corresponding to the outer shape of the flexible wired circuit board 1.

More specifically, the insulating cover layer 4 is disposed such that the both widthwise end edges thereof are placed at the same positions as the both widthwise end edges of the insulating base layer 2 in the widthwise direction when viewed in plan view. The insulating cover layer 4 is disposed such that the both longitudinal end edges thereof are slightly shorter than the both longitudinal end edges of the insulating base layer 2. Specifically, the insulating cover layer 4 is disposed over the first linear portion 9 (except for the portion where the front-side connecting terminal portions 6 are formed), the first skew portion 11, and the second linear portion 10 (except for the portion where the rear-side connecting terminal portions 7 are formed). As a result, the insulating cover layer 4 covers the wires 5 and the reinforcing layer 8 and exposes the terminal portions 30.

The thickness of the insulating cover layer 4 is in the range of, e.g., 5 to 50 μm, or preferably 10 to 30 μm.

To produce the flexible wired circuit board 1 described above, e.g., the insulating base layer 2 is first formed of a film made of an insulating material such as a polyimide resin, though not shown. Then, the conductive pattern 3 and the reinforcing layers 8 are formed of a conductive material such as copper on the insulating base layer 2. The conductive pattern 3 and the reinforcing layers 8 are formed simultaneously in the foregoing pattern by a known patterning method such as a subtractive method or an additive method. Then, the insulating cover layer 4 is formed of an insulating material such as a polyimide resin in the foregoing pattern on the insulating base layer 2.

In the cellular phone 21 (connecting configuration for the flexible wired circuit board 1), described next, the flexible wired circuit board 1 is wound in the middle of the longitudinal direction thereof, as shown in FIG. 3.

To wind the flexible wired circuit board 1, e.g., the rear end portion of the second linear portion 10 is rotated along the circumferential direction around the widthwise direction C1 shown in FIG. 1 as the center of rotation with respect to the front end portion of the first linear portion 9. As a result, the wound portion is formed in a helical shape along the oblique direction (direction extending obliquely between the upper left and the lower right in FIG. 3) intersecting the longitudinal direction. The flexible wired circuit board 1 is wound at least once, or preferably a plurality of times. In winding the flexible wired circuit board 1, the second linear portion 10 is rotated, while shifting in one widthwise direction (to the right in FIG. 3) from the first linear portion 9.

The both end portions of each of the wound portion are formed to cross each other and extend in different directions, i.e., in directions in which they are apart from each other.

The flexible wired circuit board 1 is wound immediately before it is connected to the upper connector 26 and the lower connector 27, or wound in advance.

To wind the flexible wired circuit board 1 in advance, there is used e.g., a method which winds the flexible wired circuit board 1 immediately after the production around a columnar stick under tension, a method which differentiates the linear expansion coefficient of the insulating base layer 2 from that of the insulating cover layer 4 in the production of the flexible wired circuit board 1, or the like.

In the method which differentiates the linear expansion coefficient of the insulating base layer 2 from that of the insulating cover layer 4, e.g., the insulating base layer 2 and the insulating cover layer 4 are formed of insulating materials having different linear expansion coefficients when a flexible wired circuit board sheet in which a plurality of the flexible wired circuit boards 2 are aligned is produced, though not shown. Thereafter, when each of the flexible wired circuit boards 1 is cut away from the flexible wired circuit board sheet, the flexible wired circuit board 1 is naturally wound.

With respect to times of winding the flexible wired circuit board 1, it can be counted as one time when the rear-side connecting terminal portions 7 exposed on the front-face side are wound 360° with respect to the front-side connecting terminal portions 6 exposed on the front-face side and then exposed again on the front-face side when viewed in plan view. The number of winding the flexible wired circuit board 1 is three times in FIG. 3. However, the number of winding is not limited thereto. It is sufficient when the flexible wired circuit board 1 is wound one time or more. Preferably, the number of winding the flexible wired circuit board 1 is set to two or more, or more preferably two to ten.

Next, a description will be given to the cellular phone 21 as an embodiment of the electronic device including the connecting configuration according to the present invention with reference to FIG. 4.

As shown in FIG. 4, the cellular phone 21 is a thin slidable cellular phone extending in the longitudinal direction (left-to-right direction in FIG. 4). The cellular phone 21 includes an upper casing 22 as a first supporting member, a lower casing 23 as a second supporting member, and the flexible wired circuit board 1.

The upper casing 22 is in the shape of a generally rectangular flat plate. The upper casing 22 includes a liquid-crystal display portion 28 in the upper surface thereof, and houses an upper substrate 24 for controlling liquid-crystal display on the liquid-crystal display portion 28 embedded therein.

The upper substrate 24 includes the upper connector 26 as a first terminal member provided on the lower surface of the upper substrate 24. The upper connector 26 is disposed on the one longitudinal end portion (right end portion in FIG. 4) of the upper substrate 24.

The lower casing 23 is disposed to face the upper casing 22 in the thickness direction (vertical direction). As shown in FIG. 4(a), the lower casing 23 is formed in the shape of a generally rectangular flat plate which is the same as the shape of the upper casing 22 when viewed in plan view to be superimposed on the upper casing 22 during non-operation of the cellular phone 21. The lower casing 23 includes an operation panel portion 29 in the upper surface of the one longitudinal end thereof, and houses a lower substrate 25 for controlling an operation signal for the operation panel portion 29.

The lower substrate 25 is disposed to face the upper substrate 24 in the thickness direction during non-operation of the cellular phone 21. The lower substrate 25 includes the lower connector 27 as a second terminal member provided on the upper surface of the lower substrate 25. The lower connector 27 is disposed on the one longitudinal end portion (right end portion in FIG. 4) of the lower substrate 25 to face the upper connector 26 of the upper substrate 24 in the thickness direction during non-operation of the cellular phone 21.

The lower casing 23 is coupled to the upper casing 22 by a slide mechanism not shown. The lower casing 23 is provided to be longitudinally slidable with respect to the upper casing 22. As a result, the lower connector 27 is linearly movable along the longitudinal direction to be adjacent to and apart from the upper connector 26.

The flexible wired circuit board 1 in the wound state described above has the front-side connecting terminal portions 6 (see FIG. 1) connected to the upper connector 26 and the rear-side connecting terminal portions 7 (see FIG. 1) connected to the lower connector 27. As a result, the flexible wired circuit board 1 is provided to be wound in the middle of the longitudinal direction thereof between the upper casing 22 and the lower casing 23 and to electrically connect the upper connector 26 and the lower connector 27.

During non-operation of the cellular phone 21, the upper casing 22 is superimposed on the lower casing 23 in the thickness direction and disposed at the same position when viewed in plan view, as shown in FIG. 4(a). When the use of the cellular phone 21 is started, the operation panel portion 29 of the lower casing 23 is exposed from the upper casing 22 by sliding the lower casing 23 toward one longitudinal direction with respect to the upper casing 22, as shown in FIG. 4(b). By thus sliding the lower casing 23, the lower connector 27 is linearly moved toward one longitudinal direction to be apart from the upper connector 26, while the flexible wired circuit board 1 extends along the longitudinal direction.

After the use of the cellular phone 21 is ended, the lower casing 23 is slid toward the other longitudinal direction with respect to the upper casing 22 such that the operation panel portion 29 of the lower casing 23 is covered with the upper casing 22. By thus sliding the lower casing 23, the lower connector 27 is linearly moved toward the other longitudinal direction to be adjacent to the upper connector 26, while the flexible wired circuit board 1 contracts along the longitudinal direction.

In the cellular phone 21, the flexible wired circuit board 1 is provided to be wound in the moving direction in which the lower connector 27 linearly moves with respect to the upper connector 26, i.e., in the middle of the longitudinal direction.

Therefore, when the lower casing 23 slides toward one longitudinal direction with respect to the upper casing 22 to be apart therefrom, i.e., when the lower connector 27 linearly moves toward one longitudinal direction with respect to the upper connector 26 to be apart therefrom, the wound portion in the middle of the longitudinal direction of the flexible wired circuit board 1 extends, while the radius of curvature of the entire wound portion gradually decreases.

On the other hand, when the lower casing 23 slides toward the other longitudinal direction with respect to the upper casing 22 to be adjacent thereto, i.e., when the lower connector 27 linearly moves toward the other longitudinal direction with respect to the upper connector 26 to be adjacent thereto, the wound portion in the middle of the longitudinal direction of the flexible wired circuit board 1 contracts, while the radius of curvature of the entire wound portion gradually increases.

This avoids local fatigue of the flexible wired circuit board 1 and allows effective prevention of a broken wire in the conductive pattern 3 of the flexible wired circuit board 1 resulting from continued use.

As a result, it is possible to reduce the thickness by decreasing the radius of curvature of the wound portion and ensure the reliability of electrical connection between the upper connector 26 and the lower connector 27 over a long period of time.

Since the reinforcing layers 8 can reinforce the flexible wired circuit board 1 in the middle of the longitudinal direction thereof, it is possible to extend or contract the wound portion, while ensuring the rigidity of the flexible wired circuit board 1. This allows more effective prevention of a broken wire in the conductive pattern 3 of the flexible wired circuit board 1.

In the cellular phone 21, the sliding of the lower casing 23 with respect to the upper casing 22 ensures linear movement of the lower connector 27 with respect to the upper connector 26. As a result, it is possible to ensure an improvement in the connection reliability of the flexible wired circuit board 1, while ensuring linear movement of the lower connector 27 with respect to the upper connector 26.

When the lower connector 27 linearly moves with respect to the upper connector 26, the wound portion extends or contracts along the moving direction, i.e., the longitudinal direction. This allows an efficient reduction in the stress exerted by the movement on the flexible wired circuit board 1. As a result, a broken wire in the conductive pattern 3 resulting from local fatigue can be more effectively prevented.

In the description given above, the upper connector 26 is provided on the one longitudinal end portion of the upper substrate 24 and the lower connector 27 is provided on the one longitudinal end portion of the lower substrate 25. However, the placement of each of the connectors is not limited thereto. For example, it is possible to provide both the upper connector 26 and the lower connector 27 on the other longitudinal end portion. Alternatively, it is also possible to provide the upper connector 26 on the one longitudinal end portion and provide the lower connector 27 on the other longitudinal end portion, or provide the upper connector 26 on the other longitudinal end portion and provide the lower connector 27 on the one longitudinal end portion. Otherwise, the upper connector 26 and/or the lower connector 27 may also be provided in the middle of the longitudinal direction.

In the description given above, the lower casing 23 is provided slidable with respect to the upper casing 22. However, it is not limited thereto. For example, the upper casing 22 may be provided slidable with respect to the lower casing 23. Otherwise, both of the upper casing 22 and the lower casing 23 can be provided slidable individually with respect to the lower casing 23 and the upper casing 22.

In the description given above, the reinforcing layers 8 are provided in the flexible wired circuit board 1. However, it is also possible to form the flexible wired circuit board 1 without providing the reinforcing layers 8 depending on the application and purpose of the flexible wired circuit board 1. When the reinforcing layers 8 are not provided, the process steps of producing the flexible wired circuit board 1 can be simplified and the flexible wired circuit board 1 can be easily produced.

In the description given above, the cellular phone 21 is used as an example of the electronic device. However, it is not limited thereto. Examples of various slidable electronic devices may include a notebook personal computer, an electronic dictionary, and a personal digital assistant (PDA).

Figure 5:
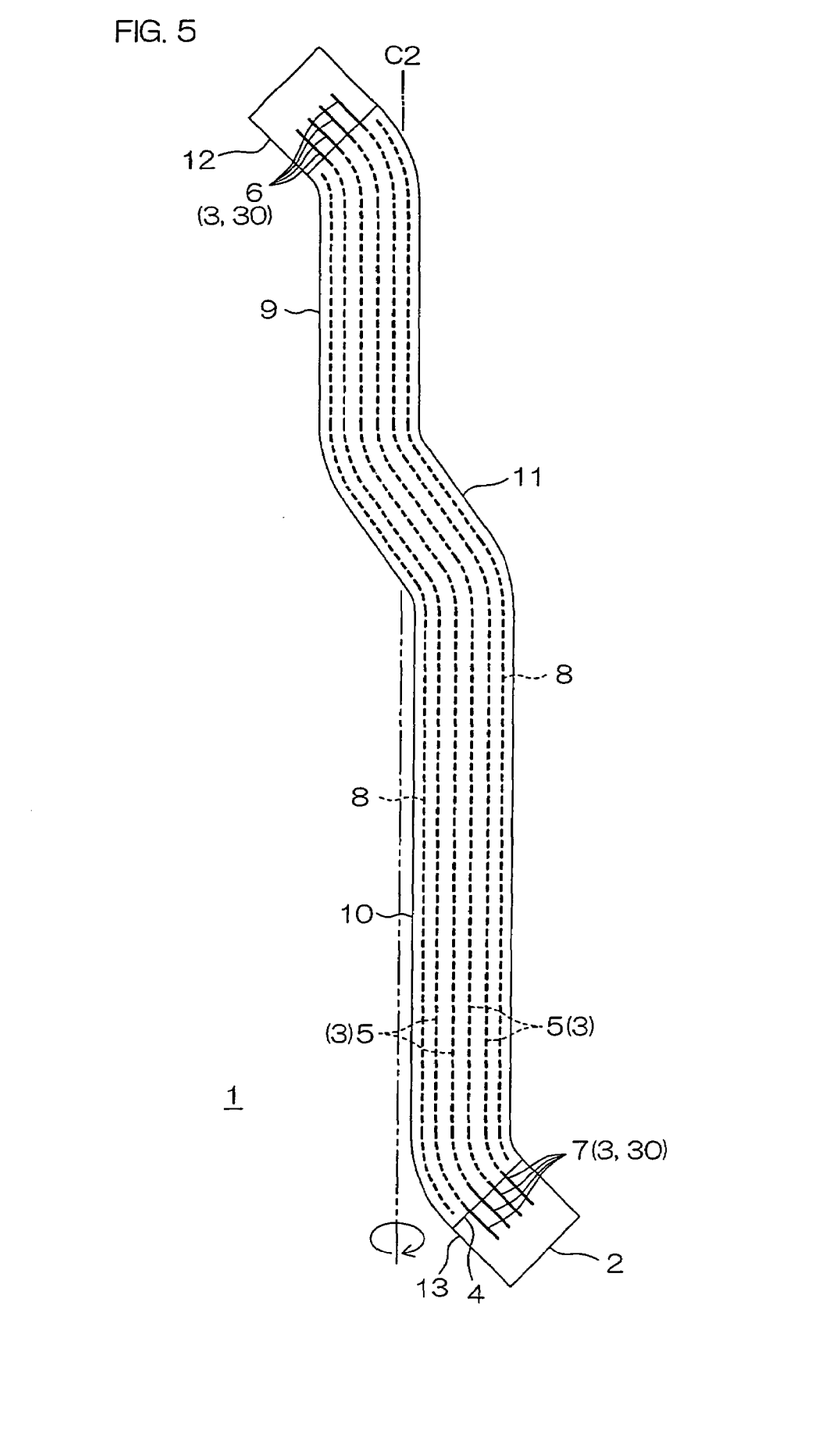
FIG. 5 is a plan view of another embodiment (twisted embodiment) of the flexible wired circuit board used in the connecting configuration for the flexible wired circuit board according to the present invention.
Figure 6:
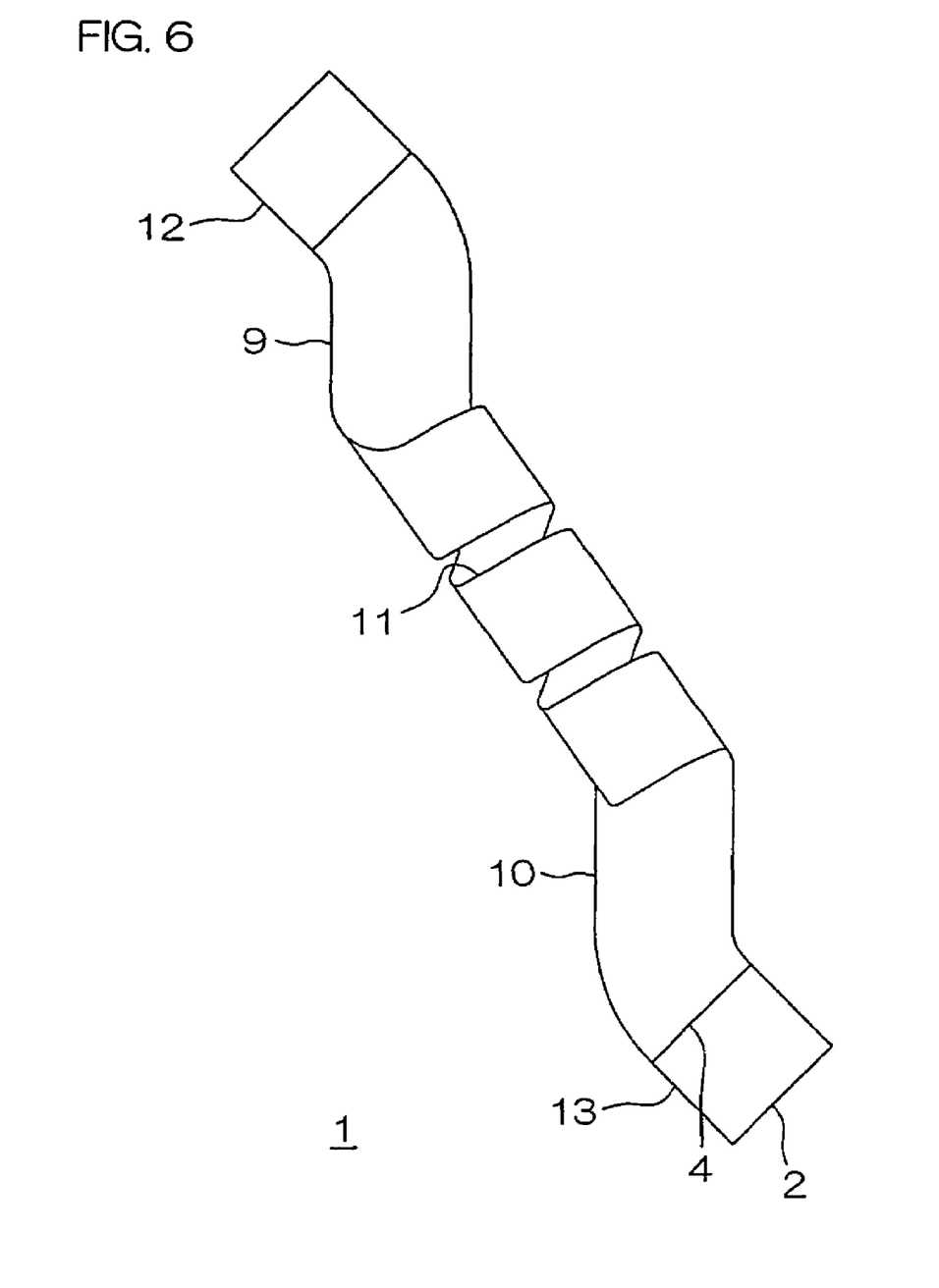
FIG. 6 is a view illustrating a twisted state of the flexible wired circuit board shown in FIG. 5.
Figure 7:
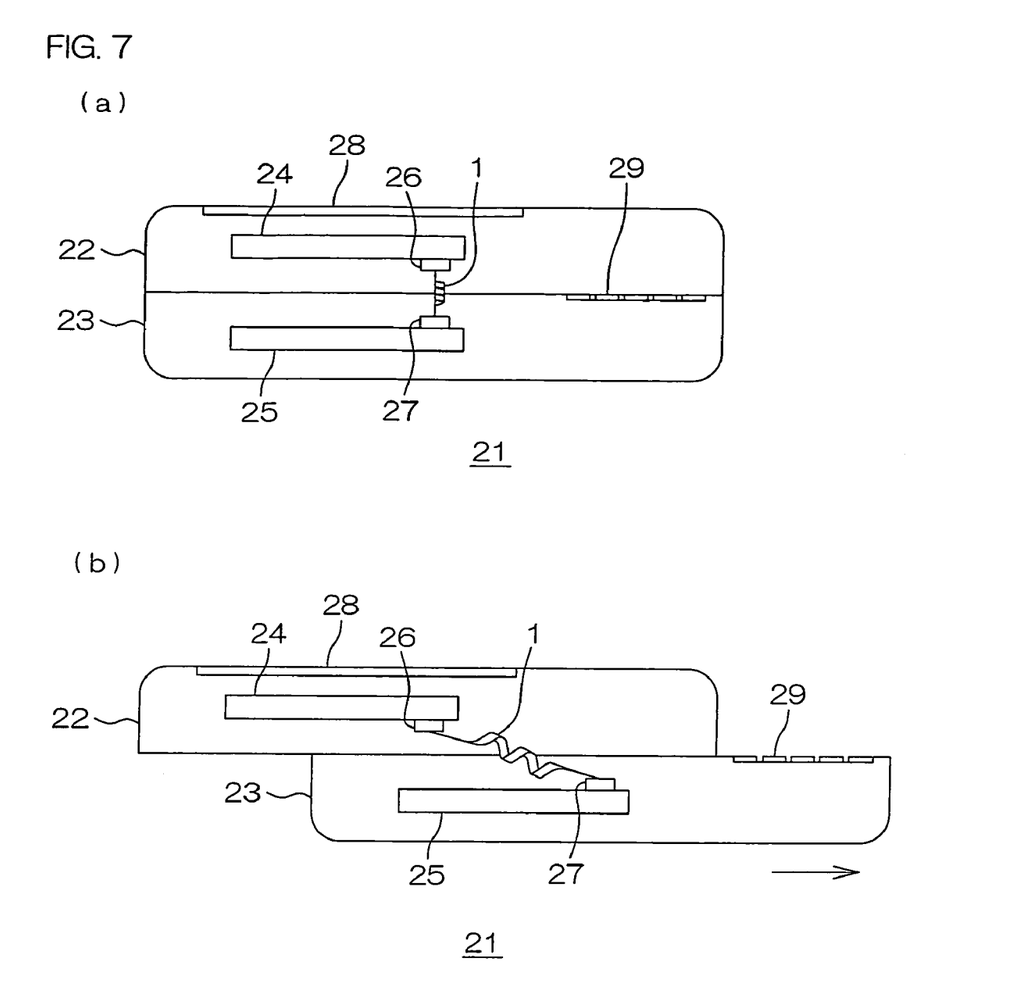
FIG. 7 is a side cross-sectional view of a cellular phone including the connecting configuration for the flexible wired circuit board shown in FIG. 6 as another embodiment (twisted embodiment) of the electronic device according to the present invention, (a) showing a side cross-sectional view in a non-operating state, and (b) showing a side cross-sectional view in an operating state.
Figure 8:
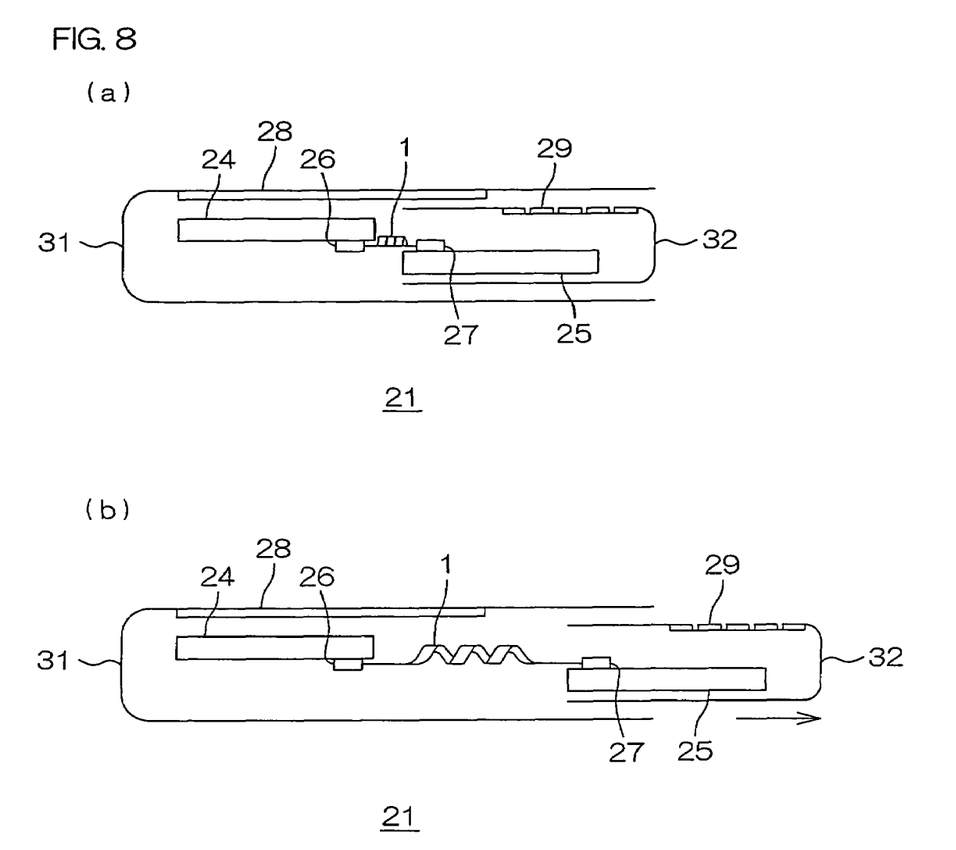
FIG. 8 is a side cross-sectional view of a cellular phone including the connecting configuration for the flexible wired circuit board shown in FIG. 6 as still another embodiment (embodiment in which an inner casing is accommodated in an outer casing) of the electronic device according to the present invention, (a) showing a side cross-sectional view in a non-operating state, and (b) showing a side cross-sectional view in an operating state.

FIG. 5 is a plan view of another embodiment (twisted embodiment) of the flexible wired circuit board used in the connecting configuration for the flexible wired circuit board according to the present invention. FIG. 6 is a view illustrating a twisted state of the flexible wired circuit board shown in FIG. 5. FIG. 7 is a side cross-sectional view of a cellular phone including the connecting configuration for the flexible wired circuit board shown in FIG. 6 as another embodiment (twisted embodiment) of the electronic device according to the present invention, (a) showing a side cross-sectional view in a non-operating state, and (b) showing a side cross-sectional view in an operating state. FIG. 8 is a side cross-sectional view of a cellular phone including the connecting configuration for the flexible wired circuit board shown in FIG. 6 as still another embodiment (embodiment in which an inner casing is accommodated in an outer casing) of the electronic device according to the present invention, (a) showing a side cross-sectional view in a non-operating state, and (b) showing a side cross-sectional view in an operating state. In the drawings of FIGS. 5 to 8, the members corresponding to the individual members described above are designated by the same reference numerals and a detailed description thereof is omitted. In FIG. 6, the conductive pattern 3 is omitted for clear illustration of the twisted state of the flexible wired circuit board.

In the description given above, one first skew portion 11 is formed as the skew portion in the flexible wired circuit board 1, and the flexible wired circuit board 1 is wound. However, it is also possible to, e.g., form a second skew portion 12 and a third skew portion 13 as two skew portions in addition to the first skew portion 11, as shown in FIG. 5, and twist the flexible wired circuit board 1, as shown in FIG. 6.

In FIG. 5, the flexible wired circuit board 1 integrally includes the first linear portion 9, the second linear portion 10, the first skew portion 11, the second skew portion 12, and the third skew portion 13.

The second skew portion 12 is disposed on the front end portion of the flexible wired circuit board 1 and formed in a linear shape extending along an oblique direction intersecting the longitudinal direction, which is the same as the oblique direction of the first skew portion 11, to continue to the front end portion of the first linear portion 9. On the front end portion of the second skew portion 12, the front-side connecting terminal portions 6 are formed.

The third skew portion 13 is disposed on the rear end portion of the flexible wired circuit board 1 and formed in a linear shape extending along an oblique direction intersecting the longitudinal direction, which is the same as the oblique direction of the first skew portion 11, to continue to the rear end portion of the second linear portion 10. On the rear end portion of the third skew portion 12, the rear-side connecting terminal portions 7 are formed.

On the front-end side thereof, the flexible wired circuit board 1 is formed to be curved and bent in the oblique direction from the front end portion of the first linear portion 9 to reach the rear end portion of the second skew portion 12. On the rear-end side thereof, the flexible wired circuit board 1 is formed to be curved and bent in the oblique direction from the rear end portion of the second linear portion 10 to reach the third skew portion 13.

The widthwise center lines of the front-side connecting terminal portions 6 along the extending directions thereof are shifted in a perpendicular direction to the above-mentioned oblique direction from the widthwise center lines of the rear-side connecting terminal portions 7 along the extending directions thereof.

As shown in FIG. 6, the flexible wired circuit board 1 is twisted in the middle of the longitudinal direction thereof.

To twist the flexible wired circuit board 1, e.g., the rear end portion of the second linear portion 10 is rotated along the circumferential direction around the longitudinal direction C2 shown in FIG. 5 as the center of rotation with respect to the front end portion of the first linear portion 9. As a result, the twisted portion is formed in a helical shape along the longitudinal direction. The flexible wired circuit board 1 is twisted at least once, or preferably a plurality of times.

The both end portions of each of the twisted portion are formed to extend in different directions, i.e., in directions in which they are apart from each other.

To twist the flexible wired circuit board 1, the same method as any of the winding methods mentioned above is used. The number of twisting the flexible wired circuit board 1 is the same as the above-mentioned number of winding the flexible wired circuit board 1.

Next, a description will be given to the cellular phone 21 as another embodiment of the electronic device including the connecting configuration according to the present invention with reference to FIG. 7.

In FIG. 7, the flexible wired circuit board 1 in the twisted state described above connects the upper connector 26 and the lower connector 27. As a result, the flexible wired circuit board 1 is provided to be twisted in the middle of the longitudinal direction between the upper casing 22 and the lower casing 23 and to electrically connect the upper connector 26 and the lower connector 27.

In the cellular phone 21, the flexible wired circuit board 1 is provided to be twisted in the moving direction in which the lower connector 27 linearly moves with respect to the upper connector 26, i.e., in the middle of the longitudinal direction.

Therefore, when the lower casing 23 slides toward one longitudinal direction with respect to the upper casing 22 to be apart therefrom, i.e., when the lower connector 27 linearly moves toward one longitudinal direction with respect to the upper connector 26 to be apart therefrom, the twisted portion in the middle of the longitudinal direction of the flexible wired circuit board 1 extends, while the radius of curvature of the entire twist portion gradually decreases.

On the other hand, when the lower casing 23 slides toward the other longitudinal direction with respect to the upper casing 22 to be adjacent thereto, i.e., when the lower connector 27 linearly moves toward the other longitudinal direction with respect to the upper connector 26 to be adjacent thereto, the twisted portion in the middle of the longitudinal direction of the flexible wired circuit board 1 contracts, while the radius of curvature of the entire twisted portion gradually increases.

This avoids local fatigue of the flexible wired circuit board 1 and allows effective prevention of a broken wire in the conductive pattern 3 of the flexible wired circuit board 1 resulting from continued use.

As a result, it is possible to reduce the thickness by decreasing the radius of curvature of the twisted portion and also ensure the reliability of electrical connection between the upper connector 26 and the lower connector 27 over a long period of time.

In the flexible wired circuit board 1, the reinforcing layers 8 makes it possible to extend or contract the twisted portion, while ensuring the rigidity of the flexible wired circuit board 1. This allows more effective prevention of a broken wire in the conductive pattern 3 of the flexible wired circuit board 1.

In the description give above, the lower casing 23 is provided to be located under the upper casing 22 during non-operation of the cellular phone 21. However, as shown in FIG. 8, it is also possible to provide an inner casing 32 as the second supporting member such that it is accommodated in an outer casing 31 as the first supporting member.

In FIG. 8, the cellular phone 21 includes the outer casing 31, the inner casing 32, and the flexible wired circuit board 1.

The outer casing 31 is formed in the shape of a box which is opened in one longitudinal direction. More specifically, the outer casing 31 includes an upper wall, a lower wall, and side walls coupling the respective peripheral ends of the upper wall and the lower wall, while the side way on the longitudinal side is opened. The outer casing 31 has an inner space formed between the upper wall and the lower wall to accommodate the inner casing 32, described next. The outer casing 31 includes the liquid-crystal display portion 28 in the upper surface of the upper wall, and houses the upper substrate 24 on the other longitudinal side in the outer casing 31.

The upper substrate 24 includes the upper connector 26 provided on the lower surface of the upper substrate 24.

The upper connector 26 is disposed on the one longitudinal end portion of the upper substrate 24.

The inner casing 32 is formed in the shape of a box which is opened in the other longitudinal direction. More specifically, the inner casing 32 includes an upper wall, a lower wall, and side walls coupling the respective peripheral ends of the upper wall and the lower wall, while the side wall on the other longitudinal is opened. The inner casing 32 is formed to have a size so that the inner casing 32 can be accommodated in the outer casing 31. As shown in FIG. 8(a), the inner casing 32 is entirely accommodated in the inner space of the outer casing 31 during non-operation of the cellular phone 21. The inner casing 32 includes the operation panel portion 29 in the upper surface of the upper wall and houses the lower substrate 25.

The lower substrate 25 is provided to face the upper substrate 24 in the longitudinal direction (sliding direction) so as not to overlap in the thickness direction. The lower substrate 25 includes the lower connector 27 provided on the upper surface thereof.

The lower connector 27 is disposed on the other longitudinal end portion of the lower substrate 25 to face the upper connector 26 in the longitudinal direction.

The inner casing 32 is coupled to the outer casing 31 by a slide mechanism not shown. The inner casing 32 is provided slidable with respect to the outer casing 31 in the longitudinal direction.

The flexible wired circuit board 1 connects between the upper connector 26 and the lower connector 27 and is twisted in the middle of the longitudinal direction of the flexible wired circuit board 1.

During non-operation of the cellular phone 21, the inner casing 32 is accommodated in the outer casing 31, as shown in FIG. 8(a). When the use of the cellular phone 21 is started, the inner casing 32 is slid to be drawn from the outer casing 31 to expose the operation panel portion 29 of the inner casing 32 from the outer casing 31, as shown in FIG. 8(b). By sliding the inner casing 32, the lower connector 27 is linearly moved with respect to the upper connector 26 to be apart therefrom, while the flexible wired circuit board 1 extends along the longitudinal direction.

When the use of the cellular phone 21 is ended, the inner casing 32 is slid to be contained in the outer casing 32 such that the operation panel portion 29 of the inner casing 32 is covered with the outer casing 31, as shown in FIG. 8(a). By sliding the inner casing 32, the lower connector 27 is linearly moved with respect to the upper connector 26 to be adjacent thereto, while the flexible wired circuit board 1 contracts along the longitudinal direction.

During non-operation of the cellular phone 21, the inner casing 32 is accommodated in the outer casing 31 and the upper substrate 24 and the lower substrate 25 are provided to face in the longitudinal direction so as not to overlap each other in the thickness direction. As a result, it is possible to further reduce the thickness of the cellular phone 21 and also ensure the reliability of electrical connection between the upper connector 26 and the lower connector 27 over a long period of time.

In the description given above, a single-sided flexible wired circuit board is used as an example of the flexible wired circuit board 1 used in the present invention. However, the flexible wired circuit board used in the present invention is not limited thereto. The present invention is widely applicable to various flexible wired circuit boards such as, e.g., a double-sided flexible wired circuit board and a multilayer flexible wired circuit board.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A connecting configuration for a flexible wired circuit board, comprising:
a first terminal member;
a second terminal member; and
a flexible wired circuit board having a conductive pattern for electrically connecting the first terminal member and the second terminal member, wherein
the first terminal member and the second terminal member are provided such that at least one of the terminal members is linearly movable to be adjacent to and apart from the other terminal member, wherein
the flexible wired circuit board comprises:
a first linear portion;
a second linear portion; and
a first skew portion disposed between the first linear portion and the second linear portion and extending along an oblique direction intersecting the longitudinal direction of each of the first linear portion and the second linear portion, and wherein,
the flexible wired circuit board is provided with a wound part formed in a helical shape in a middle of a moving direction along the oblique direction intersecting the longitudinal direction by rotation of the rear end portion of the second linear portion along the circumferential direction around an axis passing through the first skew portion in the widthwise direction perpendicular to the longitudinal direction as the center of rotation with respect to the front end portion of the first linear portion.

2. An electronic device comprising:
a connecting configuration for a flexible wired circuit board, the connecting configuration comprising:
a first terminal member;
a second terminal member; and
a flexible wired circuit board having a conductive pattern for electrically connecting the first terminal member and the second terminal member, wherein
the first terminal member and the second terminal member are provided such that at least one of the terminal members is linearly movable to be adjacent to and apart from the other terminal member, wherein
the flexible wired circuit board comprises:
a first linear portion;
a second linear portion; and
a first skew portion disposed between the first linear portion and the second linear portion and extending along an oblique direction intersecting the longitudinal direction of each of the first linear portion and the second linear portion, and wherein,
the flexible wired circuit board is provided with a wound part formed in a helical shape in a middle of a moving direction along the oblique direction intersecting the longitudinal direction by rotation of the rear end portion of the second linear portion along the circumferential direction around an axis passing through the first skew portion in the widthwise direction perpendicular to the longitudinal direction as the center of rotation with respect to the front end portion of the first linear portion.

3. A connecting configuration for a flexible wired circuit board, comprising:
a first terminal member;
a second terminal member; and
a flexible wired circuit board having a conductive pattern for electrically connecting the first terminal member and the second terminal member, wherein
the first terminal member and the second terminal member are provided such that at least one of the terminal members is linearly movable to be adjacent to and apart from the other terminal member, wherein
the flexible wired circuit board comprises:
a first linear portion;
a second linear portion;
a first skew portion disposed between the first linear portion and the second linear portion and extending along an oblique direction intersecting the longitudinal direction of the first linear portion and the second linear portion;
a second skew portion extending along a same oblique direction of the first skew portion to continue to the front end portion of the first linear portion; and a third skew portion extending along the same oblique direction of the first skew portion to continue to the rear end portion of the second linear portion; and wherein the flexible wired circuit board is provided with a twisted part formed in a helical shape in a middle of a moving direction along the longitudinal direction by rotation of the rear end portion of the second linear portion along the circumferential direction around an axis passing through the first skew portion in the longitudinal direction as the center of rotation with respect to the front end portion of the first linear portion.

4. An electronic device comprising:

a connecting configuration for a flexible wired circuit board, the connecting configuration comprising:

a first terminal member;

a second terminal member; and a flexible wired circuit board having a conductive pattern for electrically connecting the first terminal member and the second terminal member, wherein the first terminal member and the second terminal member are provided such that at least one of the terminal members is linearly movable to be adjacent to and apart from the other terminal member, wherein the flexible wired circuit board comprises:

a first linear portion;

a second linear portion;

a first skew portion disposed between the first linear portion and the second linear portion and extending along an oblique direction intersecting the longitudinal direction of the first linear portion and the second linear portion;

a second skew portion extending along a same oblique direction of the first skew portion to continue to the front end portion of the first linear portion; and a third skew portion extending along the same oblique direction of the first skew portion to continue to the rear end portion of the second linear portion; and wherein the flexible wired circuit board is provided with a twisted part formed in a helical shape in a middle of a moving direction along the longitudinal direction by rotation of the rear end portion of the second linear portion along the circumferential direction around an axis passing through the first skew portion in the longitudinal direction as the center of rotation with respect to the front end portion of the first linear portion.

* * * * *